(12) United States Patent
Keller

(10) Patent No.: US 9,766,757 B2
(45) Date of Patent: Sep. 19, 2017

(54) SENSOR ELEMENT DEVICE FOR A CAPACITIVE TOUCH SWITCH OF AN OPERATING DEVICE, OPERATING DEVICE, AND HOB

(71) Applicant: E.G.O. Elektro-Gerätebau GMBH, Oberderdingen (DE)

(72) Inventor: Hartmut Keller, Weingarten (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 0 days.

(21) Appl. No.: 14/401,779

(22) PCT Filed: May 16, 2013

(86) PCT No.: PCT/EP2013/060205
§ 371 (c)(1),
(2) Date: Nov. 17, 2014

(87) PCT Pub. No.: WO2013/174728
PCT Pub. Date: Nov. 28, 2013

(65) Prior Publication Data
US 2015/0123936 A1  May 7, 2015

(30) Foreign Application Priority Data
May 21, 2012  (DE) .......................... 10 2012 010 321

(51) Int. Cl.
*H03K 17/96* (2006.01)
*G06F 3/044* (2006.01)

(52) U.S. Cl.
CPC ........... *G06F 3/044* (2013.01); *H03K 17/962* (2013.01); *G06F 2203/04112* (2013.01);
(Continued)

(58) Field of Classification Search
CPC ... G06F 3/044; H03K 17/962; H03K 17/9622
See application file for complete search history.

(56) References Cited

U.S. PATENT DOCUMENTS 5,917,165 A   6/1999  Platt et al.
5,973,417 A   10/1999  Goetz et al.
(Continued)

FOREIGN PATENT DOCUMENTS

DE    102006039132 A1    3/2008
DE    102008047325    *    3/2010
(Continued)

OTHER PUBLICATIONS

International Searching Authority, International Search Report for International Application No. PCT/EP2013/060205, Sep. 16, 2013, 6 pages, European Patent Office, The Netherlands.

*Primary Examiner* — Alexander Eisen
*Assistant Examiner* — Cory Almeida
(74) *Attorney, Agent, or Firm* — Alston & Bird LLP

(57) ABSTRACT

A sensor element device for a capacitive touch switch of an operating device faces with an upper side toward the underside of a control panel of the operating device and has an illuminated display with a lighting means. Provided around the lighting means is a housing with fastening means for fastening the sensor element device to a component carrier. Provided on the outside of the housing or of the structural unit, in the region toward the upper side there is electrically conductive plastic that extends along an outer periphery of the housing. From the electrically conductive plastic there extends in the direction of the underside, toward the component carrier, a contacting means for the electrical connection thereto.

16 Claims, 2 Drawing Sheets

(52) U.S. Cl.
CPC ............. *H03K 2017/9602* (2013.01); *H03K 2217/96076* (2013.01); *H03K 2217/96079* (2013.01)

(56) References Cited

U.S. PATENT DOCUMENTS

| | | |
|---|---|---|
| 8,552,746 B2 | 10/2013 | Pfau et al. |
| 2011/0025643 A1 | 2/2011 | Dombrowski et al. |
| 2012/0126834 A1 | 5/2012 | Kleinhans |
| 2012/0161795 A1* | 6/2012 | Pfau ................ H03K 17/962 324/679 |

FOREIGN PATENT DOCUMENTS

| | | |
|---|---|---|
| DE | 102008047325 A1 | 3/2010 |
| DE | 102009036161 A1 | 2/2011 |
| DE | 102009036162 A1 | 2/2011 |
| DE | 102011056711 A1 | 6/2012 |
| EP | 0859467 A1 | 8/1998 |
| EP | 0859468 A1 | 8/1998 |
| WO | WO 2005/043760 A1 | 5/2005 |
| WO | WO 2009/153161 A1 | 12/2009 |

* cited by examiner

SENSOR ELEMENT DEVICE FOR A CAPACITIVE TOUCH SWITCH OF AN OPERATING DEVICE, OPERATING DEVICE, AND HOB

CROSS REFERENCE TO RELATED APPLICATIONS

This application is a National Stage application, filed under 35 U.S.C. §371, of International Application PCT/EP2013/060205, filed May 16, 2013, which claims priority to German Application No. 10 2012 010 321.2, filed May 21, 2012, both of which are hereby incorporated by reference in their entirety.

TECHNOLOGICAL FIELD

Embodiments of the present invention relates to a sensor element device for a capacitive touch switch of an operating device, such an operating device and also a hob with such an operating device.

BACKGROUND

DE 10 2009 036 162 A1 discloses a sensor element device for a capacitive touch switch that has an illuminated display with lighting means. A frame like body of plastic sits on an annular body of elastic, electrically conductive plastic, the two being fitted over an LED as lighting means. Here there is the disadvantage that fastening is not possible with point precision, especially because it is not easy to attach the elastic plastic in the form of a foam rubber precisely in position on a printed circuit board.

SUMMARY

Embodiments of the present invention addresses the problem of providing a sensor element device mentioned at the beginning, an operating device provided therewith and also a hob with which problems of the prior art can be avoided, and it is possible in particular to provide an embodiment that is suitable for practical purposes that can also be produced on an industrial scale with precision and at low costs, and as far as possible can also be installed in an automated manner.

This problem is solved by a sensor element device, an operating device, and a hob. Advantageous and preferred configurations of one embodiment of the present invention are the subject of the further claims and are explained in more detail below. In this case, some of the features mentioned are mentioned only for the sensor element device, the operating device or the hob. However, irrespective of that, they are intended to be able to apply independently not only to the sensor element device but also to the operating device and to the hob. The wording of the claims is made the content of the description by express reference.

It is provided that the sensor element device has an upper side, which faces the underside of a control panel of the operating device. It may possibly even be placed against it. Furthermore, the sensor element device has an illuminated display with a lighting means, a lighting direction being directed toward the underside of the control panel, as far as possible for radiating through it.

It is provided according to one embodiment of the present invention that a housing is provided around the lighting means, or the sensor element device has a housing. For fastening the sensor element device to a component carrier, the housing has fastening means, the two together forming a structural unit. Under some circumstances, they may even be formed in one piece, which is explained in more detail below. Provided on the outside of the housing or of the structural unit, at least in the region toward the upper side, there is an electrically conductive plastic, alternatively an electrically conductive metallic component, with a shape that at least partially follows an outer periphery of the housing or of the structural unit. This electrically conductive plastic or the metallic component forms the functional capacitive sensor element for the capacitive touch switch on the control panel, by which the approach or placement of a finger on the upper side of the control panel above the sensor element device can be detected and evaluated in a known way, see for example EP 859467 A1 and EP 859468 A1. An electrical contacting means is provided from the electrically conductive plastic or metallic component on the upper side of the sensor element device in the direction of the underside, toward the component carrier, or extends as an electrical connection to the component carrier and to an activating and/or evaluating means. This electrical contacting means or a connection to the capacitive sensor element in the form of the electrically conductive plastic or metallic component may be formed variously, as still to be explained in more detail below.

Consequently, embodiments of the present invention can provide a structural unit that on the one hand has a housing which can surround a lighting means for the illuminated display. On its upper side, it has a sensor element for the capacitive touch switch that belongs to the structural unit. Furthermore, the structural unit has fastening means, in order to be fastened to a component carrier, preferably without requiring any tools. In an advantageous configuration, electrical contacting is intended to take place here simultaneously as an electrical connection of the sensor element. Thus, the aforementioned installation that is quick and as automated as possible is indeed possible, which is of great advantage especially in the case of operating devices with a large number of such sensor element devices.

In a further advantageous configuration of one embodiment of the present invention, the electrically conductive plastic on the upper side may be elastic, for example as silicone rubber or TPE. It may have a hardness of 30 to 80 Shore A, preferably 40 to 70, in particular 50 to 60. It can thus be compressed by applying a relatively small pressing force and lie well against the underside of the control panel with a simultaneous spring effect. It may be particularly advantageously provided here that only the elastic electrically conductive plastic is pressed against the underside of the control panel, but not the rest of the housing or the rest of the structural unit.

In a further advantageous configuration of one embodiment of the present invention, it is possible that the electrically conductive plastic, in particular if it is elastic, or else the metallic component protrudes a little beyond the upper side of the housing or of the structural unit. This may be by an amount of approximately 1 μm to 1 mm or 2 mm, preferably by 50 μm to 500 μm. The projection is therefore very small and should indeed only be such that, when a slight pressing force is applied, the rest of the upper side of the housing extends just below the control panel.

It is advantageously provided that the electrical contacting means for the electrical connection of the sensor element to the component carrier in the lower region of the structural unit also comprises an electrically conductive plastic, which in turn is particularly advantageously elastic with the aforementioned properties. It may preferably be the same plastic. An electrical contacting means for the electrically conductive plastic or metallic component on the upper side as a sensor element may in particular likewise comprise an electrically conductive plastic, which may be applied as a partially or completely continuous layer to the outer side of the housing or of the structural unit. In a particularly advantageous configuration of one embodiment of the present invention, it is the same electrically conductive plastic in all three cases, which therefore is provided not only on the upper side as a sensor element but also on the underside as an electrical contacting means to make electrical contact with a contact zone or a contact pin on the component carrier and also as an electrical connection between the two regions.

It is advantageously also applied in a single step by a corresponding injection-molding operation. The electrical contacting means on the underside toward the component carrier may be relatively small, in particular have dimensions of 1 mm to 5 mm in length or width. The electrical connection between them may be of a similar size, but may also extend completely around the periphery.

In the case of a polygonal cross section of the housing or of the structural unit, preferably a quadrangular or rectangular cross section, the electrically conductive plastic or the metallic component on the upper side runs along at least one side. Advantageously two or three sides, so that the capacitive sensor element formed therefrom becomes larger or more sensitive and more effective. It advantageously runs around four sides or is formed so as to extend completely around the periphery, that is to say as a kind of frame. The size should in this case be approximately such that placement of a finger on the upper side of the control panel can be detected well, that is to say for example from 5×5 mm to 15×15 mm.

In an advantageous configuration of one embodiment of the present invention, when formed in the aforementioned way with plastic on the underside for the electrical contacting thereof, there may form a kind of offset extending at least partially, preferably completely, around the periphery. With this offset, the structural unit can be pressed against contacting means on the component carrier as a connection.

In a further configuration of one embodiment of the present invention, it may be provided that the lateral outer side of the structural unit is covered, preferably overmolded or encapsulated with plastic, at least where an electrical contacting means or electrically conductive material is provided. This plastic may be of the kind that is used for the housing together with the fastening means, that is to say advantageously also electrically insulating. This injection-molding operation should take place in the same multi-component injection molding as for the production of the housing together with the fastening means and the molding-on of the electrically conductive plastic. Then such a sensor element device can be automated to the greatest extent possible, and consequently be produced with precision, without faults and at low cost. The electrically conductive plastic is also advantageously molded onto the housing or onto the structural unit, at least that on the upper side and/or that on the underside. Here, too, multi-component injection molding may be advantageous, in particular as three-component injection molding.

In a further configuration of one embodiment of the present invention, it is possible also to form the upper side of the housing or of the structural unit as electrically conductive. This allows the surface area of the capacitive sensor element to be increased further in size, the electrically conductive upper side then of course being connected to the lateral electrically conductive plastic or metallic component. This is advantageously provided at least in a region extending peripherally in the manner of a frame within the outer edge of the housing or of the structural unit, it being possible for a frame to have a width of 1 mm to 4 mm. In a free intermediate region, the lighting means can radiate through. If the electrically conductive material on the upper side of the housing, that is to say above the lighting means, is light-transmissive, it may also be provided over the full surface area.

In a somewhat different configuration of one embodiment of the present invention, the upper side of the housing or of the structural unit may be covered with an opaque electrically conductive layer. This is in turn in electrical contact with the externally surrounding electrically conductive plastic or the metallic component, so that in turn a considerably larger two-dimensional capacitive sensor element is produced. Since the material is opaque, it has to be removed at least in certain regions in order that the lighting means can radiate through. Here it is even possible in an extension of one embodiment of the present invention that the opaque layer is removed in certain regions precisely in such a way that a symbol is exposed for a symbol display as an illuminated display. Thus, no other maskings or the like are needed. Removal of the layer for the symbol may take place for example by means of a laser. The opaque electrically conductive layer may likewise be a layer of plastic, which is applied in the same multicomponent injection molding as previously mentioned. Alternatively, it may be applied later. The use of a corresponding lacquer, which can then be structured, is also possible.

In a further configuration of one embodiment of the present invention, it is possible that the housing or the structural unit has on its upper side or toward the upper side a light conducting body, which extends over the lighting means. The housing may therefore not only surround the lighting means in the manner of a ring but also the light-conducting body, at least in a lower region. The light-conducting body may in this case also form a kind of diffuser for the light, in order to create a uniformly illuminated symbol display or illuminated display. Furthermore, it may have corresponding light-collecting properties, in particular also by being configured on its lower side as a light entry side. As mentioned at the beginning, it can also be produced in a multi-component injection-molding operation together with the housing and be an integral component part of the structural unit. The light-conducting body may form an outer periphery of the structural unit, in particular toward the upper side, so that the electrically conductive plastic for the sensor element is provided on the outside of the light-conducting body.

In yet a further configuration of one embodiment of the present invention, the housing may have on its upper side or toward the upper side a light-diffusing body over the lighting means. The light-diffusing body is advantageously designed as a so-called diffusing screen and likewise provides a uniform light effect in a way corresponding to the aforementioned diffuser properties. An aforementioned light-conducting body or else the mentioned light-diffusing body with corresponding properties allows a colored illuminated display to be created. Similarly, by masking or being configured correspondingly, they can form a symbol display.

The fastening means may have at least one downwardly protruding fastening element, which can be inserted into a correspondingly formed opening in the component carrier. For fastening that is secure and free from twisting, there are advantageously two fastening elements. The fastening elements may particularly advantageously have different cross sections in the direction of insertion or longitudinal direction, so that confusion of the insertion position is avoided. Finally, a fastening element may be designed for self-securing insertion, for example by clamping on the basis of relatively large cross sections or by barbs or latching hooks, so that it is possible to dispense with other means of fastening, such as adhesive bonding or the like.

An operating device mentioned at the beginning has a component carrier, on which at least one sensor element device described above is arranged and/or fastened. Furthermore, the sensor element device is also in electrical contact with the component carrier, in particular as a connection of the capacitive sensor element and also of the lighting means. The operating device also has an aforementioned control panel, on the underside of which the sensor element device lies. By placing a finger on the control panel, corresponding control can be performed, as is known to a person skilled in the art from the aforementioned prior art.

In a particularly advantageous configuration of one embodiment of the present invention, the operating device is intended for a hob, so that the control panel may be a hob plate of the hob. In this case, a number of sensor element devices may indeed be provided on a component carrier under the hob plate and make various switching functions possible. These and other features emerge not only from the claims but also from the description and the drawings, where the individual features can be realized in each case by themselves or as a plurality in the form of subcombinations in an embodiment of one embodiment of the present invention and in other fields and can constitute advantageous and inherently protectable embodiments for which protection is claimed here. The subdivision of the application into individual sections and subheadings does not restrict the general validity of the statements made thereunder.

BRIEF DESCRIPTION OF THE SEVERAL VIEWS OF THE DRAWINGS

Exemplary embodiments of the invention are illustrated schematically in the drawings and are explained in greater detail below. In the drawings.

DETAILED DESCRIPTION

Figure 1:
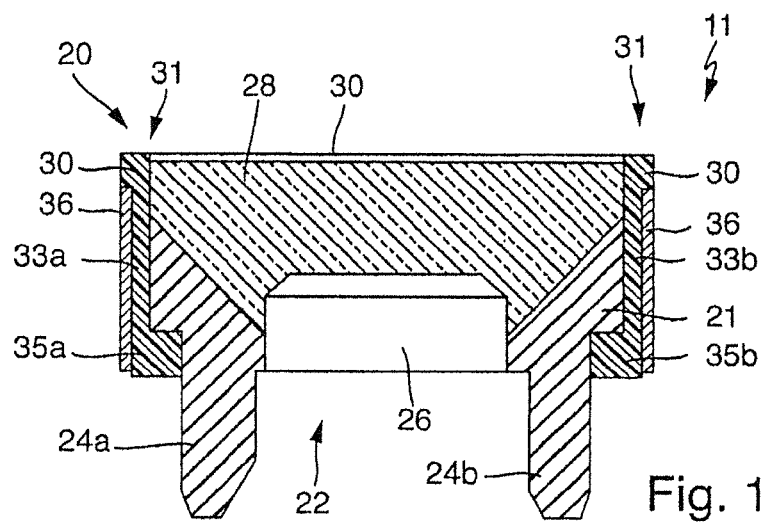
FIG. 1 shows a lateral sectional representation of a sensor element device according to one embodiment of the present invention with a multi-part housing.

In FIG. 1, a sensor element device according to one embodiment of the present invention is represented in a variant of an embodiment in lateral section.

The sensor element device 11 has an upper side 20 of a housing 22, the housing consisting of plastic, as previously explained.

Figure 2:
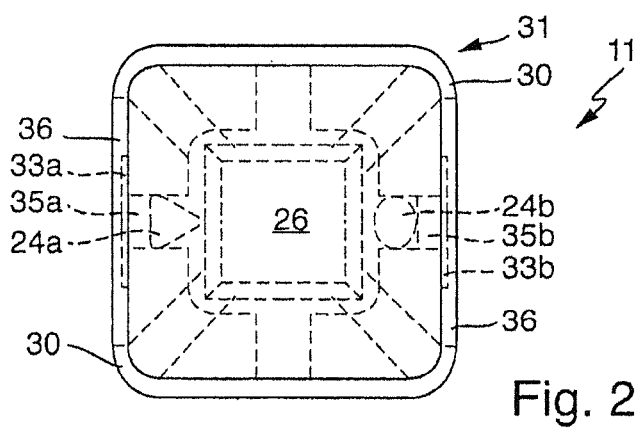
FIG. 2 shows a plan view of the sensor element device from FIG. 1.

Molded onto the bottom of the housing 22 are on the left a fastening pin 24a and on the right a somewhat differently formed fastening pin 24b, the cross sections of which can be seen from the plan view from FIG. 2. The housing 22 has here a lower part 21, from which the mentioned fastening pins 24a and b protrude, the lower part 21 consisting of opaque insulating plastic, which is advantageously generally inelastic or rigid. An upper part of the housing 22 is formed by a light-conducting body 28 of light-transmissive plastic, it being possible for this either to be completely transparent or else translucent, so that it can for example have the diffuser properties mentioned at the beginning for a uniform lighting effect.

A clearance 26, in which an LED or a lighting means is arranged, as further described below, is provided both in the lower part 21 and in the light-conducting body 28 of the housing 22. The lower part 21 and the light-conducting body 28 together form the housing 22, or are part thereof, and are advantageously produced together in one multi-component injection-molding operation.

Molded onto the upper outer side of the housing 15 22, or here the light-conducting body 28, is a peripherally extending collar 30, the configuration of which can also be seen from the plan view from FIG. 2. The collar 30 consists here of elastic and electrically conductive plastic, for example an electrically conductive silicone, and is advantageously molded onto the housing 22 or the light-conducting body 28. The peripherally extending collar 30 also forms at the same time the capacitive sensor element 31 mentioned at the beginning. As can be seen, the collar 30 protrudes slightly, for example 50 µm to 100 µm, beyond the upper side 20.

When viewed together with the plan view from FIG. 2, it can be seen how a strip-like electrical connecting-contacting means 33a and b is respectively molded on under the collar 30, externally to the left and right of the housing 22. They respectively go over at the bottom into a left-hand and right-hand electrical contacting bar 35a and 35b, the form of which can in turn be seen from FIG. 2, which though not all that long is however much wider. It is advantageous if, as shown, the collar 30, the connecting-contacting means 33 and the contacting bars are produced from the same material, particularly advantageously in one piece. In this way, the capacitive sensor element 31 can be brought into 5 electrical contact at the bottom, at the contacting bar 35a and b, which is still to be explained in more detail below. In this case, the contacting bar 35a and 35b may protrude slightly, for example 50 µm to 100 µm, beyond the underside of the lower part 21, as described above for the upper side.

Molded on laterally to the outside of the housing 22, in particular by injection molding, is a jacket 36, which advantageously consists of the same plastic as the lower part 21. The jacket 36 may be formed so as to extend around the entire periphery, and thus cover over the connecting-contacting means 33a and 33b. Alternatively, the jacket 36 may be provided only on the left-hand and right-hand outer sides, over the connecting-contacting means 33.

Figure 3:
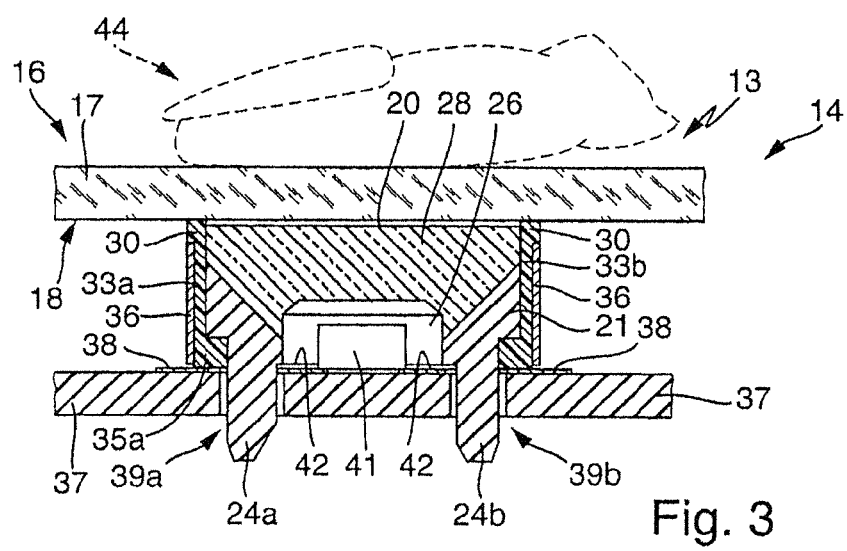
FIG. 3 shows a sectional representation through an operating device of a hob with the sensor element device from FIG. 1 on a printed circuit board together with an LED.

In FIG. 3, a fitted state is shown for the sensor element device 11, to be precise as a capacitive touch switch 13 with the capacitive sensor element 31 as the operating device 14. The operating device 14 is provided on a hob 16 or integrated therein, to be precise, as described at the beginning, with a hob plate 17, advantageously of hard glass or glass ceramic, as a control panel. For actuation, a finger 44, represented by dashed lines, may be placed on top of the hob plate 17, as a control panel, which can be detected in the customary way by the capacitive sensor element 31 together with the activating means.

It is evident that the sensor element device 11 is pressed against an underside 18 of the hob plate 17, and the plastic collar 30 of the capacitive sensor 35 element 31 is thereby compressed somewhat. The upper side 20 of the housing 22 or of the light-conducting body 28 may in this case be at a small distance from the underside 18, for example 10 µm to 100 μm. Alternatively, it may also be in direct contact, depending on the applied pressing force chosen.

The sensor element device 11 has been pressed in with the fastening pins 24a and 24b into holes 39a and 39b of a printed circuit board 37 as a component carrier. The fastening holes 39 are in this case designed such that this pressing-in takes place in a force-fitting and clamping manner, so that it is possible to dispense with further fastening. On the upper side of the printed circuit board 37 there are outside the fastening holes 39 two contacting zones 38, advantageously as customary copper zones. In between the fastening holes 39 there are two contact zones 42. The contacting bars 35a and b of the sensor element device 11 have been pressed onto the contacting zones 38, and thus represent the electrical contact with the capacitive sensor element 31, that is to say by means of the connecting-contacting means 33a and b to the left and right. Electrical contacts may under some circumstances also be improved by the provision of conductive adhesive or conductive paste, which however is not absolutely necessary.

An LED 41 has been applied to the contact zones 42, in particular securely soldered, which has taken place before the sensor element device 11 is mounted. Consequently, the LED 41 is installed before the sensor element device 11.

In the case of the configuration described here, it is primarily provided that the capacitive sensor element 31 is formed only by the collar 30 of plastic, which according to FIG. 2 extends around the 35 entire periphery. If this collar 30 has a side length of 5 mm to 15 mm, mentioned at the beginning, it is possible with such a capacitive sensor element 31 for the placement of the finger 44 according to FIG. 3 above it to be detected sufficiently well. An 5 additional improvement of the sensing of an actuation can take place by the upper side 20 of the light conducting body 28 being covered with a transparent and electrically conductive layer, for example a transparent conductive lacquer or a layer of transparent tin oxide. Then, the capacitive sensor element is formed by the entire surface area of the upper side together with the peripherally extending collar 30. It is alternatively possible, as explained at the beginning, to form such an electrically conductive coating of the upper side 20 as electrically conductive but opaque, and in this case either leave free or subsequently cut out, for example by machining or laser working, a symbol or a desired illuminated display. In this way it is therefore possible on the 20 one hand to easily produce a desired symbol display, or on the other hand to improve the accuracy of the sensing and provide an easier possibility for an electrically conductive layer on the upper side 20. In a still further configuration of one embodiment of the present invention, an electrically conductive layer may extend as a frame a few millimeters wide within the collar 30, which then leaves a zone free in the middle, for example in a way corresponding to the clearance 26.

Figure 4:
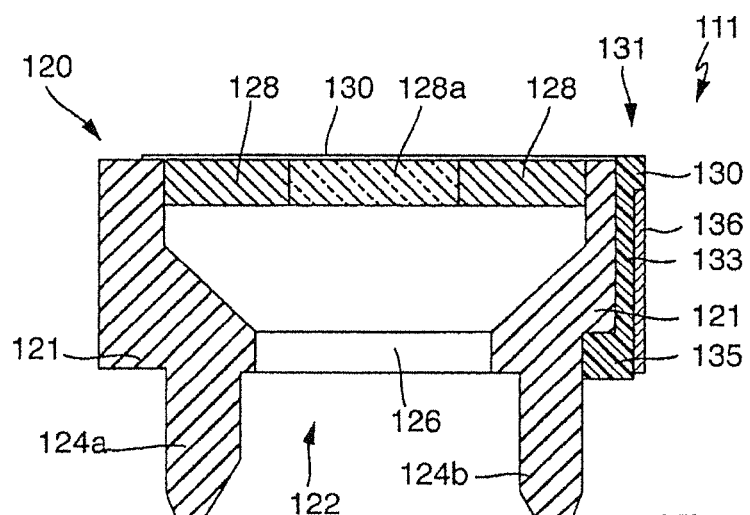
FIG. 4 shows a modified form of the sensor element device from FIGS. 1 and 15

In FIG. 4, a further modification of the 30 invention is shown in the case of a sensor element device 111, which is fitted in just the same way as that shown in FIG. 3. In the form shown, a housing 122 consists only of the lower part 121, onto the bottom of which the fastening pins 124a and b have been 35 molded in the form according to FIGS. 1 and 2, the lower part 121 consisting of opaque plastic. Only on the right-hand side is an electrical connecting contacting means 133 together with an electrical contacting bar 135 molded onto a collar 130 of electrically conductive plastic in the way according to FIG. 1. The collar 130 again protrudes a little beyond the upper side 120, as previously explained. Once again there is injection-molded onto the outside thereof in certain regions a covering 136 of the same plastic as the lower part 121.

Fitted here above a clearance 126 in the housing 122 there is not a light-conducting body but a diffusing screen 128, which is much thinner. It consists of opaque material and has in the middle a symbol region 128A of transparent or translucent material, as previously described. The symbol region 128 may have the form of a specific symbol, for example a plus sign or other sign. The diffusing screen 128 may be produced in one piece by multi-component injection molding and then subsequently be made to fit into the housing 122 or into the lower part 121. Alternatively, it may also be produced together with it, it then being possible for example for the plastic that surrounds the symbol region 128a to be produced together with that of the lower part 121, that is to say as one part and in one piece. The illuminated display is consequently formed by the LED 141 as lighting means together with the light-conducting body 28 or the diffusing screen 128 together with the symbol region 128a, and can be seen through the translucent hob plate 17.

Figure 5:
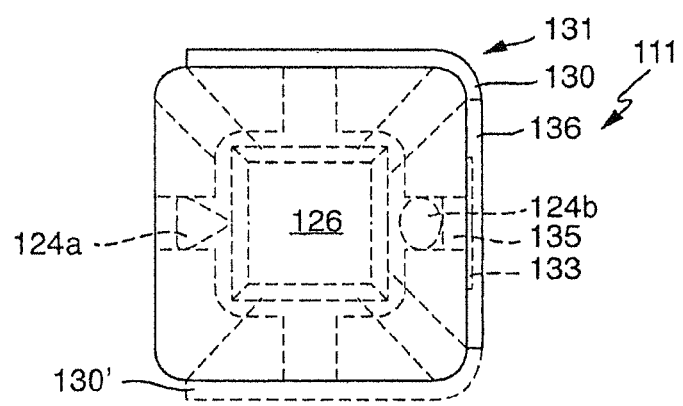
FIG. 5 shows a plan view of the sensor element device from FIG. 4.

It can be seen in the plan view from FIG. 5 that the collar 130 is only provided on the upper side shown there and the right-hand side, that is to say as it were only as a kind of angle, and consequently not extending peripherally in a way corresponding to FIG. 2. Even this may already be sufficient for the function of the capacitive sensor element 131. In addition, as represented by dashed lines, a lower collar part 130' may also be provided, so that altogether the collar 130 has a U shape. Here, too, on the upper side 120, as already explained in general above in relation to FIG. 3, electrically conductive material may in turn be provided on the upper side 120 as a layer, which is electrically connected to the collar 130 and consequently increases the size of the surface area of the capacitive sensor element 131.

In a variation of one embodiment of the present invention that is not shown here but can be easily imagined, instead of the collar of plastic 30 or 130, such a collar or a peripherally extending part of metal may also be provided, for example as a metal frame or the like. Something similar may also apply to the lower contacting bar 35 or 135. Such metal parts may then be injection-molded into the housing.

Furthermore, it is possible to form a connecting-contacting means 33 or 133 not from a molded-on electrically conductive plastic but from conductive lacquer. Alternatively, it may also be a metal part, onto which electrically conductive plastic is injection-molded at the top and bottom as a collar and contacting bars, and the electrical contacting takes place by physical contact and overlapping.

One embodiment of the present invention can provide a sensor element device which creates a capacitive touch switch over a simply formed lighting means, for example as an LED, so that an operator merely has to place a finger over a lighted-up symbol or an illuminated display. Furthermore, the various configurations of the sensor element device of the illuminated display that have been described allow a specific form of symbol or other form to be achieved. Therefore, a symbol display and a capacitive touch switch are integrated into a single 35 component or a single structural unit. The simple application of pressure to install the sensor element device as an electrical contacting means makes it possible to dispense with complex contacting steps such as soldering or the like, and the pressing of the 5 sensor element device onto a printed circuit board over a preinstalled LED already completes installation. Furthermore, the sensor element device may be placed lightly or with pressure against the underside of a hob plate or some other control panel. Depending on the pressing force and the configuration of the capacitive sensor element, a certain elastic effect can be achieved, and the upper side of a light-conducting body or a diffusing screen can also be very close to the underside to allow good identification of the illuminated display.

In a further configuration of one embodiment of the present invention, at least one of the fastening pins may also be formed electrically conductively, either from electrically conductive plastic or by an electrically conductive coating. The electrical contacting may then be established for example by insertion into an internally copper-plated fastening hole in a printed circuit board, it being possible for a corresponding conductor track on the printed circuit board to be provided on the upper side or the underside.

The invention claimed is:

1. A hob with a hob plate and an operating device comprising at least one sensor element device for a capacitive touch switch of the operating device with a control panel, said operating device comprising:
  a component carrier for being arranged thereupon, the control panel being provided, wherein said sensor element device lies on an underside of said hob plate forming said control panel; and
  a number of sensor element devices;
  wherein each of said sensor element devices comprises:
    an upper side, toward an underside of said control panel, and having an illuminated display with a lighting means, with a lighting direction toward said underside of said control panel, wherein a housing is provided around said lighting means and said housing together with fastening means for fastening said sensor element device to said component carrier forming a structural unit;
    on said upper side, a sensor element for said capacitive touch switch belonging to said structural unit;
    an electrically conductive plastic that extends at least partially along an outer periphery of said housing or of said structural unit, wherein said outer periphery corresponds to an exterior of said housing or of said structural unit, wherein said electrically conductive plastic forms said sensor element;
    said electrically conductive plastic protrudes slightly beyond said upper side of said housing or of said structural unit; and
    a contacting means extending from said electrically conductive plastic on said upper side of said sensor element device in a direction to said underside, toward said component carrier, for an electrical connection to said component carrier.

2. The hob as claimed in claim 1, wherein said electrically conductive plastic is elastic.

3. The hob as claimed in claim 1, wherein said electrical contacting means for said electrical connection to said component carrier in said lower region of said structural unit also comprises an electrically conductive plastic.

4. The hob as claimed in claim 3, wherein said electrically conductive plastic is elastic.

5. The hob as claimed in claim 3, wherein said electrical contacting means for said electrically conductive plastic on said upper side likewise comprise an electrically conductive plastic, which is applied as a continuous layer to said outside.

6. The hob as claimed in claim 1, wherein, in case of a polygonal cross section of said housing or of said structural unit, said electrically conductive plastic on said upper side runs along at least one side.

7. The hob as claimed in claim 6, wherein, in case of a polygonal cross section of said housing or of said structural unit, said electrically conductive plastic on said upper side runs along at least three sides.

8. The hob as claimed in claim 1, wherein, on a lateral outer side of said structural unit, said electrically conductive plastic is largely encapsulated with a plastic such as that which is also used for said housing together with said fastening means.

9. The hob as claimed in claim 1, wherein said electrically conductive plastic is injection-molded onto said housing or said structural unit in a multi-component injection-molding operation.

10. The hob as claimed in claim 1, wherein said upper side of said housing or of said structural unit is likewise formed electrically conductively at least in a region extending peripherally in a manner of a frame within an outer edge of said housing.

11. The hob as claimed in claim 1, wherein said upper side of said housing or of said structural unit is covered with an opaque electrically conductive layer, which is in electrical contact with said externally surrounding electrically conductive plastic, a symbol for a symbol display of the illuminated display being produced by removal of said layer in certain regions.

12. The hob as claimed in claim 1, wherein said housing has on its upper side or toward its upper side a light-conducting body, said light-conducting body extending over said lighting means.

13. The hob as claimed in claim 12, wherein said housing surrounds said light-conducting body in a manner of a ring, at least in a lower region.

14. The hob as claimed in claim 1, wherein said housing has on its upper side or toward its upper side a light-diffusing body, said light-diffusing body extending over said lighting means.

15. The hob as claimed in claim 1, wherein said fastening means comprises at least one downwardly protruding fastening element for inserting into an opening in said component carrier.

16. The hob as claimed in claim 1, wherein said fastening means comprises at least two fastening elements, said at least two fastening elements comprising different cross sections in a direction of insertion and are designed for self-securing insertion.

* * * * *